(«12») United States Patent
Bae et al.

(10) Patent No.: US 10,647,890 B2
(45) Date of Patent: *May 12, 2020

(54) ADHESIVE COMPOSITION, ADHESIVE FILM COMPRISING SAME, AND ORGANIC ELECTRONIC DEVICE COMPRISING SAME

(71) Applicant: LG CHEM, LTD., Seoul (KR)

(72) Inventors: Kyung Yul Bae, Daejeon (KR); Yoon Gyung Cho, Daejeon (KR); Hyun Jee Yoo, Daejeon (KR); Se Woo Yang, Daejeon (KR)

(73) Assignee: LG CHEM, LTD., Seoul (KR)

(*) Notice: Subject to any disclaimer, the term of this patent is extended or adjusted under 35 U.S.C. 154(b) by 79 days.

This patent is subject to a terminal disclaimer.

(21) Appl. No.: 15/580,193

(22) PCT Filed: Jun. 9, 2016

(86) PCT No.: PCT/KR2016/006130
§ 371 (c)(1),
(2) Date: Dec. 6, 2017

(87) PCT Pub. No.: WO2016/200179
PCT Pub. Date: Dec. 15, 2016

(65) Prior Publication Data
US 2018/0171188 A1   Jun. 21, 2018

(30) Foreign Application Priority Data

Jun. 9, 2015  (KR) .................. 10-2015-0081475
Aug. 20, 2015 (KR) .................. 10-2015-0117379

(51) Int. Cl.

| | | |
|---|---|---|
| *C09J 4/00* | (2006.01) | |
| *C09J 7/38* | (2018.01) | |
| *C09J 123/22* | (2006.01) | |
| *H05K 3/28* | (2006.01) | |
| *C09J 7/20* | (2018.01) | |
| *C08G 59/40* | (2006.01) | |
| *C09J 7/30* | (2018.01) | |
| *C09J 4/06* | (2006.01) | |
| *H01L 51/52* | (2006.01) | |
| *H01L 51/00* | (2006.01) | |
| *C09J 109/00* | (2006.01) | |
| *C09J 163/00* | (2006.01) | |
| *H05K 1/02* | (2006.01) | |
| *H05K 1/03* | (2006.01) | |
| *C09J 11/08* | (2006.01) | |

(52) U.S. Cl.
CPC .......... *C09J 7/381* (2018.01); *C08G 59/4007* (2013.01); *C09J 4/00* (2013.01); *C09J 4/06* (2013.01); *C09J 7/20* (2018.01); *C09J 7/30* (2018.01); *C09J 109/00* (2013.01); *C09J 123/22* (2013.01); *C09J 163/00* (2013.01); *H01L 51/004* (2013.01); *H01L 51/0043* (2013.01); *H01L 51/0097* (2013.01); *H01L 51/5246* (2013.01); *H01L 51/5253* (2013.01); *H05K 1/028* (2013.01); *H05K 1/0313* (2013.01); *H05K 3/285* (2013.01); *C08F 2500/01* (2013.01); *C08F 2500/02* (2013.01); *C09J 11/08* (2013.01); *C09J 2203/326* (2013.01); *C09J 2423/00* (2013.01); *C09J 2425/00* (2013.01); *C09J 2463/00* (2013.01); *H01L 2251/5338* (2013.01); *Y02E 10/549* (2013.01)

(58) Field of Classification Search
CPC ..... C09J 4/00; C09J 123/22; C09J 4/06; C09J 7/381; C09J 163/00; C09J 109/00; C09J 7/20; C09J 7/30; C09J 11/08; C09J 2463/00; C09J 2425/00; C09J 2423/00; C09J 2203/326; H05K 3/285; H05K 1/028; H05K 1/0313; C08G 59/4007; H01L 51/5246; H01L 51/0097; H01L 51/0043; H01L 51/004; H01L 51/5253; H01L 2251/5338; C08F 255/10; C08F 2500/02; C08F 2500/01; Y02E 10/549
See application file for complete search history.

(56) References Cited

U.S. PATENT DOCUMENTS

| | | | |
|---|---|---|---|
| 5,936,934 A * | 8/1999 | Kuribayashi et al. ................. G11B 7/2533 369/286 |
| 2003/0130427 A1 | 7/2003 | Cleary et al. | |
| 2012/0283375 A1 | 11/2012 | Kageyama | |
| 2014/0158300 A1 | 6/2014 | Hayata et al. | |
| 2014/0217382 A1 | 8/2014 | Kwon et al. | |
| 2014/0309371 A1* | 10/2014 | Ellul et al. ............... C08L 23/02 525/63 |
| 2014/0323669 A1 | 10/2014 | Kageyama | |

(Continued)

FOREIGN PATENT DOCUMENTS

| | | |
|---|---|---|
| JP | H10-278207 | 10/1998 |
| JP | H11-209713 | 8/1999 |

(Continued)

*Primary Examiner* — Nathan M Nutter

(74) *Attorney, Agent, or Firm* — Dentons US LLP

(57) ABSTRACT

The present application relates to an adhesive composition comprising a curable oligomer and a polymer derived from butylene, an adhesive film comprising same, an organic electronic device comprising same, and a lighting apparatus and a display device comprising same. The adhesive film comprising the adhesive composition shows excellent moisture-blocking properties and enables an organic electronic device to have flexibility as well as excellent and reliable durability at high temperature and high humidity.

20 Claims, 1 Drawing Sheet

(56) References Cited

U.S. PATENT DOCUMENTS

| | | |
|---|---|---|
| 2015/0079389 A1 | 3/2015 | Krawinkel et al. |
| 2015/0116432 A1 | 4/2015 | Chretien et al. |
| 2015/0155522 A1 | 6/2015 | Kim |
| 2015/0210905 A1 | 7/2015 | Hoshino et al. |
| 2015/0299518 A1 | 10/2015 | Nishijima et al. |
| 2015/0299519 A1 | 10/2015 | Nishijima et al. |
| 2015/0357570 A1 | 12/2015 | Lee et al. |
| 2018/0171179 A1* | 6/2018 | Bae et al. .............. C09J 4/00 |
| 2018/0171181 A1* | 6/2018 | Bae et al. .............. C09J 4/00 |

FOREIGN PATENT DOCUMENTS

| | | |
|---|---|---|
| JP | 2012-007046 | 1/2012 |
| JP | 2012-056971 | 3/2012 |
| JP | 2013-040323 | 2/2013 |
| JP | 2014-167051 | 9/2014 |
| JP | 2014-194942 A | 10/2014 |
| JP | 2014-208747 | 11/2014 |
| JP | 2015-086391 | 5/2015 |
| JP | 2015-098542 | 5/2015 |
| JP | 2015-520780 | 7/2015 |
| JP | 2016-520138 | 7/2016 |
| KR | 10-2008-0088606 A | 10/2008 |
| KR | 10-2012-0091349 A | 8/2012 |
| KR | 10-2013-005552 | 5/2013 |
| KR | 10-2015-0010667 A | 1/2015 |
| KR | 10-2015-0033582 A | 4/2015 |
| KR | 10-2017-0037069 | 4/2017 |
| WO | 2011/062167 | 5/2011 |
| WO | 2013/156271 A1 | 10/2013 |
| WO | 2012/077431 | 5/2014 |
| WO | 2014/119551 | 8/2014 |
| WO | 2014/190151 A1 | 11/2014 |
| WO | 2013/108731 | 5/2015 |
| WO | 2014/017524 | 7/2016 |
| WO | 2014/084350 | 1/2017 |
| WO | 2014/084352 | 1/2017 |

* cited by examiner

[Figure 1]
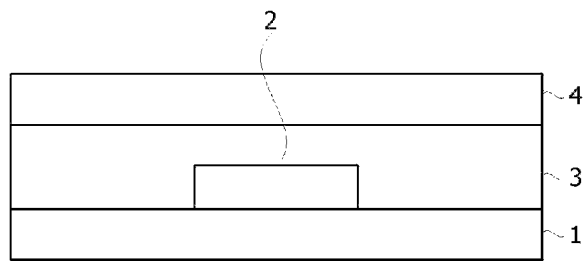
[Figure 2]
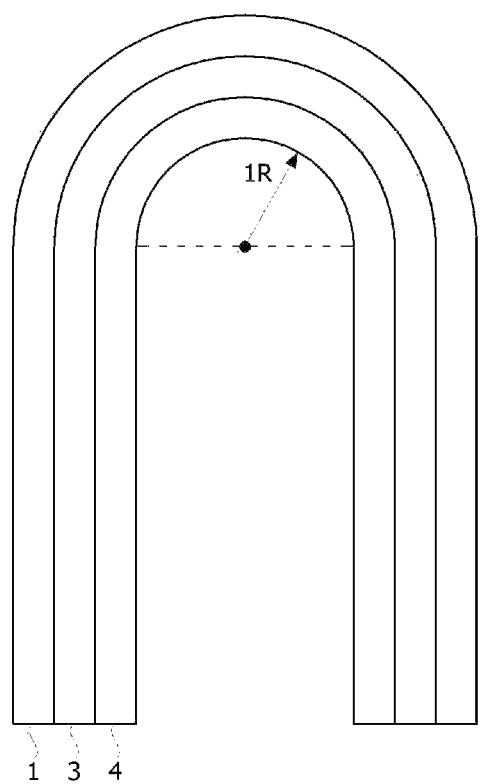

ADHESIVE COMPOSITION, ADHESIVE FILM COMPRISING SAME, AND ORGANIC ELECTRONIC DEVICE COMPRISING SAME

CROSS-REFERENCE TO RELATED APPLICATIONS

This application is a National Stage Entry of International Application No. PCT/KR2016/006130, filed Jun. 9, 2016, and claims the benefit of and priority to Korean Application No. 10-2015-0081475, filed on Jun. 9, 2015, and Korean Application No. 10-2015-0117379, filed on Aug. 20, 2015 all of which are hereby incorporated by reference in their entirety for all purposes as if fully set forth herein.

TECHNICAL FIELD

The present application relates to an adhesive composition, an adhesive film comprising the same, an organic electronic device comprising the same, and a lighting apparatus and a display device, comprising the same.

BACKGROUND ART

An organic electronic device (OED) means a device comprising an organic material layer to generate an alternating current of charges using holes and electrons. Examples of the organic electronic device may include a photovoltaic device, a rectifier, a transmitter and an organic light emitting diode (OLED), and the like.

In one embodiment, the organic light emitting diode (OLED) has a low power consumption and a fast response speed, and is advantageous for thinning a display device or lighting, as compared to an existing light source. The OLEDs are also expected to be applied in various fields covering various portable devices, monitors, notebooks, and televisions due to their excellent space utilization.

Recently, in the display field, lightening, miniaturization and flexibilization of products have been emphasized, but the glass substrates currently used are heavy, fragile and difficult to be continuously processed, so that studies for applying plastic substrates having advantages of being light and flexible and capable of continuous processing in place of the glass substrates to cellular phones, notebooks, PDAs, and the like, have been actively conducted.

DISCLOSURE

Technical Problem

The present application provides a flexible organic electronic device that does not only implement excellent moisture-blocking properties but also has excellent endurance reliability at high temperature and humidity conditions while having flexible characteristics, and an adhesive composition applied to the flexible organic electronic device and an adhesive film comprising the same.

Technical Solution

Hereinafter, embodiments of the present invention will be described in more detail with reference to the accompanying drawings. In explaining the present invention, a detailed description of known common functions and configurations incorporated herein is also omitted. The accompanying drawings are schematically shown to help understanding the present invention, where parts not related to the description have been omitted to more clearly explain the present invention. In the drawings, the thickness or size has been shown in an enlarged scale to clearly indicate several layers and regions. The scope of the present invention is not limited by the thickness, size, ratio, etc. shown in the drawings.

The present application relates to an adhesive composition. The adhesive composition can be applied to organic electronic devices having flexibility. For example, the adhesive composition may seal organic electronic elements of the organic electronic device in the form of an adhesive film entirely to protect the elements from moisture or oxygen. Considering that the adhesive composition according to the present application is applied to a flexible organic electronic device, physical properties are required for an adhesive constituting the adhesive film, in which the flexible organic electronic device comprising the cured product of the adhesive composition can effectively suppress cracks, which can be generated in the organic electronic device, despite multiple folding processes and maintain excellent brightness even after folding while relieving the stress caused by folding.

In this specification, the term "organic electronic device" means an article or a device having an element comprising an organic material layer that generates an alternating current of charges using holes and electrons between a pair of electrodes facing each other, and examples thereof may include, but are not limited to, photovoltaic devices, rectifiers, transmitters and organic light emitting diodes (OLEDs), and the like. In one example of the present invention, the organic electronic device may be an OLED.

The term adhesive herein is a term encompassing not only a material commonly referred to as an adhesive but also a layer formed using a material referred to as a so-called pressure-sensitive adhesive or a material referred to as a adhesive and pressure-sensitive adhesive.

The adhesive composition according to the present application may comprise a polymer derived from butylene and a curable oligomer. In addition, the exemplary adhesive composition may further comprise a curable monomer. The curable monomer may be distinguished from the curable oligomer in that it is not in the oligomeric form. The adhesive composition may be applied to encapsulating an organic electronic element, thereby achieving endurance reliability at high temperature and humidity together with excellent moisture-blocking properties, and prevention of cracks and maintenance of luminance in flexible organic electronic devices.

In the present application, the term "polymer derived from butylene" may mean that one or more of polymerized units in the polymer are composed of butylene. Since the polymer derived from butylene has a very low polarity, is transparent, and has almost no influence of corrosion, it can realize excellent moisture-blocking properties and endurance reliability when used as an encapsulant or sealant.

In the present application, the polymer derived from butylene may also be a homopolymer of a butylene monomer; a copolymer obtained by copolymerizing another monomer polymerizable with a butylene monomer; a reactive oligomer using a butylene monomer; or a mixture thereof. In the present application, the derived polymer may mean that the monomer forms a polymer in polymerized units. The butylene monomer may include, for example, 1-butene, 2-butene or isobutylene.

Other monomers polymerizable with the butylene monomer or derivative may include, for example, olefinic compounds such as isoprene, styrene or butadiene. By using the copolymer, physical properties such as processability and degree of cross-linking can be maintained, and the heat resistance of the adhesive itself can be secured when applied to an organic electronic device.

In addition, the reactive oligomer using the butylene monomer may comprise a butylene polymer having a reactive functional group. The butylene polymer may be bonded to other polymer having a reactive functional group. The other polymer may be alkyl (meth) acrylate, but is not limited thereto. The reactive functional group may be a hydroxy group, a carboxyl group, an isocyanate group or a nitrogen-containing group. In addition, the reactive oligomer and the other polymer may be cross-linked by a polyfunctional cross-linking agent, where the polyfunctional cross-linking agent may be one or more selected from the group consisting of an isocyanate cross-linking agent, an epoxy cross-linking agent, an aziridine cross-linking agent and a metal chelate cross-linking agent.

In one example, the polymer may be exemplified by polyisobutylene, a copolymer of isobutylene and isoprene, a copolymer of isoprene and styrene, a copolymer of isobutylene and styrene, a copolymer of butadiene and styrene, a copolymer of isoprene, butadiene and styrene, polyisoprene, polybutadiene or a copolymer of isoprene and styrene, a copolymer of butadiene and styrene, or a copolymer of isoprene, butadiene and styrene.

In the present application, the polymer may have a weight average molecular weight (MW) such that the adhesive composition can be molded into a film shape. For example, the polymer may have a weight average molecular weight of about 10,000 to 2,000,000, 50,000 to 1,000,000, 80,000 to 500,000, or 100,000 to 300,000 or so. In the present application, the term "weight average molecular weight" means a value converted to standard polystyrene measured by GPC (Gel Permeation Chromatograph). However, the polymer does not necessarily have the above-mentioned weight average molecular weight, and for example, even when the molecular weight of the polymer is not in a level to form a film, a separate binder resin may be combined to the adhesive composition.

As described above, the adhesive composition of the present application may comprise a curable oligomer. The adhesive composition according to the present application may optionally use the curable oligomer instead of a tackifier as described below. That is, the adhesive composition according to the present application may comprise no tackifier.

In one example, the curable oligomer may comprise at least one or more curable functional groups. The curable functional group may be, for example, one or more selected from a glycidyl group, an isocyanate group, a hydroxy group, a carboxyl group, an amide group, an epoxide group, a cyclic ether group, a sulfide group, an acetal group and a lactone group.

In one example, the curable oligomer may have a weight average molecular weight ranging from 400 to 10,000, from 500 to 10,000, from 800 to 10,000, from 1,000 to 10,000, from 2,000 to 9,000, or from 3,000 to 8,000. Within the above molecular weight range, the adhesive composition of the present application can be cured to have excellent moisture-blocking properties, and can be applied to a flexible organic electronic device to realize excellent heat resistance and adhesiveness.

In one embodiment of the present application, the curable oligomer may be a hydrogenated compound. The term hydrogenated compound herein may mean a compound obtained by adding hydrogen to an unsaturated bond in an organic compound, for example, a multiple bond such as a carbon-carbon double bond or triple bond or a carbonyl group. In an embodiment of the present application, the hydrogenated compound may inhibit a yellowing phenomenon of the adhesive at high temperature.

In one example, the curable oligomer may be an epoxy oligomer containing two or more functional groups, which has an epoxy equivalent of 100 g/eq to 1,500 g/eq, 150 g/eq to 1,400 g/eq, 200 g/eq to 1,200 g/eq, or 300 g/eq to 1,000 g/eq. The present application can effectively maintain properties such as adhesion performance and glass transition temperature of a cured product by using an epoxy oligomer having an epoxy equivalent in the above range.

In one example, the curable oligomer may have a cyclic structure within the molecular structure. The cyclic structure may comprise, for example, an aromatic group (e.g., a phenyl group). For example, the curable oligomer of the present application may be a hydrogenated aromatic epoxy compound. A specific example of the aromatic group-containing curable oligomer that can be used in the present application may be an oligomeric form such as a biphenyl type epoxy resin, a dicyclopentadiene type epoxy resin, a naphthalene type epoxy resin, a dicyclopentadiene modified phenol type epoxy resin, a cresol-based epoxy resin, a bisphenol-based epoxy resin, a xyloc-based epoxy resin, a polyfunctional epoxy resin, a phenol novolak epoxy resin, a triphenol methane type epoxy resin and an alkyl modified triphenol methane epoxy resin, but is not limited thereto.

In one example, the curable oligomer may be an oligomeric form of 3,4-epoxycyclohexylmethyl 3',4'-epoxycyclohexane carboxylate (EEC) and derivatives, dicyclopentadiene dioxide and derivatives, 3-ethyl-3-oxetanemethanol and derivatives, diglycidyl tetrahydrophthalate and derivatives, diglycidyl hexahydrophthalate and derivatives, 1,2-ethane diglycidyl ether and derivatives, 1,3-propane diglycidyl ether and derivatives, 1,4-butanediol diglycidyl ether and derivatives, higher 1,n-alkane diglycidyl ether and derivatives, bis[(3,4-epoxycyclohexyl)methyl]adipate and derivatives, vinylcyclohexyl dioxide and derivatives, 1,4-cyclohexanedimethanol bis(3,4-epoxycyclohexanecarboxylate) and derivatives, diglycidyl 4,5-epoxytetrahydrophthalate and derivatives, bis[1-ethyl(3-oxetanyl)methyl] ether and derivatives, pentaerythrityl tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenol novolac, hydrogenated epoxyphenol novolac, epoxycresol novolac, hydrogenated epoxycresol novolac, 2-(7-oxabicyclospiro(1,3-dioxane-5,3'-(7-oxabicyclo[4.1.0]heptane)), or 1,4-bis((2,3-epoxypropoxy)-methyl)cyclohexane. Examples of such a curable oligomer may include ST-3000 and ST-5000 from Kukdo Chemical, and YX-8000 and YX-8034 from Mitsubishi Chemical as commercially available products.

The curable oligomer may be included in an amount of 15 to 100 parts by weight, 20 to 80 parts by weight, or 20 to 70 parts by weight, relative to 100 parts by weight of the polymer derived from butylene. As the adhesive composition is applied to encapsulate the organic electronic device within the above weight range, the present application can achieve endurance reliability at high temperature and humidity together with excellent moisture-blocking properties, and prevention of cracks and luminance maintenance in flexible organic electronic devices.

In one example, the adhesive composition may further comprise a curable monomer. The curable monomer may be a cationic initiating monomer. An exemplary curable monomer may have a weight average molecular weight in the range of less than 400, 50 to 390, or 100 to 350.

In one example, the curable monomer may comprise at least one or more curable functional groups. The curable functional group may be, for example, one or more selected from a glycidyl group, an isocyanate group, a hydroxy group, a carboxyl group, an amide group, an epoxide group, a cyclic ether group, a sulfide group, an acetal group and a lactone group.

In one embodiment of the present application, as the curable monomer, an epoxy compound containing two or more functional groups can be used, which has an epoxy equivalent of 10 g/eq to 200 g/eq, 50 g/eq to 180 g/eq, or 100 g/eq to 150 g/eq. By using an epoxy compound having an epoxy equivalent in the above range, properties such as adhesion performance and glass transition temperature of the cured product can be effectively maintained.

In one example, as the curable monomer, a compound having a cyclic structure in which the ring constituent atoms in the molecular structure are in the range of 3 to 10, 4 to 9, or 5 to 8 may be used, without being limited thereto. In one example, the curable monomer may be an alicyclic epoxy compound having the cyclic structure.

An example of the curable monomer includes 3,4-epoxycyclohexylmethyl 3',4'-epoxycyclohexane carboxylate (EEC) and derivatives, dicyclopentadiene dioxide and derivatives, 3-ethyl-3-oxetanemethanol and derivatives, diglycidyl tetrahydrophthalate and derivatives, diglycidyl hexahydrophthalate and derivatives, 1,2-ethane diglycidyl ether and derivatives, 1,3-propane diglycidyl ether and derivatives, 1,4-butanediol diglycidyl ether and derivatives, higher 1,n-alkane diglycidyl ether and derivatives, bis[(3,4-epoxycyclohexyl)methyl]adipate and derivatives, vinylcyclohexyl dioxide and derivatives, 1,4-cyclohexanedimethanol bis(3,4-epoxycyclohexanecarboxylate) and derivatives, diglycidyl 4,5-epoxytetrahydrophthalate and derivatives, bis [1-ethyl(3-oxetanyl)methyl] ether and derivatives, pentaerythrityl tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenol novolac, hydrogenated epoxyphenol novolac, epoxycresol novolac, hydrogenated epoxycresol novolac, 2-(7-oxabicyclospiro(1, 3-dioxane-5,3'-(7-oxabicyclo[4.1.0]heptane)), or 1,4-bis((2, 3-epoxypropoxy)-methyl) cyclohexane.

The curable monomer may be included in an amount of 20 to 80 parts by weight, 30 to 70 parts by weight or 35 to 60 parts by weight, relative to 100 parts by weight of the polymer derived from butylene. Within the above weight range, excellent moisture-blocking properties and adhesion properties can be achieved.

In one example, when the adhesive composition comprises the curable monomer and the curable oligomer together, the curable monomer and the curable oligomer may be included in proportions of from 10 to 50 parts by weight and from 20 to 70 parts by weight, or from 20 to 45 parts by weight and from 25 to 60 parts by weight, respectively, in the above-mentioned adhesive composition. In another embodiment, the adhesive composition may comprise a polymer derived from butylene, a curable monomer and a curable oligomer in proportions of 40 to 100 parts by weight, 10 to 50 parts by weight and 20 to 70 parts by weight, respectively. The present application can realize endurance reliability at high temperature and humidity when the adhesive composition is applied to encapsulate the organic electronic element in the above weight range and realize excellent heat resistant retentivity, adhesiveness and crack prevention and luminance maintenance when the adhesive composition is applied to the organic electronic device.

In one example, if necessary, the adhesive composition may further comprise a tackifier, where the tackifier may be a hydrogenated cyclic olefin-based polymer. As the tackifier, for example, a hydrogenated petroleum resin obtained by hydrogenating a petroleum resin can be used. The hydrogenated petroleum resin may be partially or fully hydrogenated and may be a mixture of such resins. Such a tackifier may be selected from those having excellent moisture-blocking properties and low organic volatile components as well as good compatibility with the adhesive composition. A specific example of the hydrogenated petroleum resin may include hydrogenated terpene resins, hydrogenated ester resins or hydrogenated dicyclopentadiene resins, and the like. The tackifier may have a weight average molecular weight of about 200 to 5,000. The content of the tackifier can be appropriately adjusted as needed. For example, the tackifier may be included in a proportion of 5 parts by weight to 100 parts by weight or 20 to 40 parts by weight, relative to 100 parts by weight of the solid content of the adhesive composition.

In an embodiment of the present application, the adhesive composition may further comprise a curing agent or an initiator depending on the kind of the polymer, the curable oligomer or the curable monomer. For example, a curing agent capable of reacting with the polymer, the curable oligomer or the curable monomer as described above to form a cross-linked structure or the like, or a cationic initiator or a radical initiator, capable of initiating the curing reaction may be further included. As the cationic initiator, a cationic photopolymerization initiator or a cationic thermal initiator may be used.

As an exemplary curing agent, an epoxy curing agent known in the art, for example, one or two or more of an amine curing agent, an imidazole curing agent, a phenol curing agent, a phosphorus curing agent, an acid anhydride curing agent, and the like, can be used, without being limited thereto.

In one example, as the curing agent, an imidazole compound which is solid at room temperature and has a melting point or a decomposition temperature of 80° C. or higher, can be used. Such a compound can be exemplified by, for example, 2-methylimidazole, 2-heptadecylimidazole, 2-phenylimidazole, 2-phenyl-4-methylimidazole or 1-cyanoethyl-2-phenylimidazole, but is not limited thereto.

The content of the curing agent may be selected depending on composition of the composition, for example, the type and ratio of the polymer, the curable oligomer or the curable monomer. For example, the curing agent may be included in an amount of 0.01 to 20 parts by weight, 0.1 to 10 parts by weight or 1 to 5 parts by weight, relative to 100 parts by weight of the solid content of the adhesive composition. However, the weight ratio may be changed depending on the type and ratio of the curable oligomer or the curable monomer, or the functional group of the compound thereof, or the cross-linking density to be implemented, and the like.

In one example, as the cationic photopolymerization initiator, ionized cationic initiators of onium salt or organometallic salt series or organic silane or latent sulfonic acid series or non-ionized cationic photopolymerization initiator can be used. The initiator of onium salt series can be exemplified by diaryliodonium salt, triarylsulfonium salt or aryldiazonium salt, and the like, the initiator of organometallic salt series can be exemplified by iron arene and the like, the initiator of organic silane series can be exemplified by o-nitrobenzyl triaryl silyl ether, triaryl silyl peroxide or acyl silane, and the like, and the initiator of latent sulfonic acid series can be exemplified by α-sulfonyloxy ketone or α-hydroxymethylbenzoin sulfonate, and the like, without being limited thereto.

In one example, the initiator may be included in an amount of 0.01 to 20 parts by weight, 0.1 to 10 parts by weight, or 1 to 5 parts by weight, relative to 100 parts by weight of the solid content of the adhesive composition.

The adhesive composition of the present application may further comprise a high molecular weight resin. The high molecular weight resin can play a role of improving moldability, for example, when the adhesive composition of the present application is molded into a film or sheet shape. In addition, it can serve as a high-temperature viscosity controlling agent for controlling the flowability.

The type of the high molecular weight resin that can be used in the present application is not particularly limited as long as it is compatible with other components such as the polymer. A specific example of the usable high molecular weight resin is a resin having a weight average molecular weight of 20,000 or more, and may include one or a mixture of two or more of a phenoxy resin, an acrylate resin, a high molecular weight epoxy resin, a ultrahigh molecular weight epoxy resin, a high polarity functional group-containing rubber and a high polarity functional group-containing reactive rubber, and the like, but is not limited thereto.

When the high molecular weight resin is included in the adhesive composition of the present application, the content thereof is controlled depending on the desired physical properties, which is not particularly limited. For example, in the present application, the high molecular weight resin may be included in an amount of up to about 200 parts by weight, preferably up to 150 parts by weight, more preferably up to about 100 parts by weight, relative to 100 parts by weight of the polymer derived from butylene, where the lower limit is not particularly limited, but may be 30 parts by weight or more, or 50 parts by weight or more. In the present application, the content of the high molecular weight resin is controlled to 200 parts by weight or less, so that compatibility with each component of the resin composition can be effectively maintained.

The adhesive composition of the present application may comprise a moisture adsorbent, if necessary. The term "moisture adsorbent" may be used to collectively mean a component capable of adsorbing or removing moisture or humidity introduced from the outside through physical or chemical reaction or the like. That is, it means a moisture-reactive adsorbent or a physical adsorbent, the mixtures of which can be used.

The moisture-reactive adsorbent chemically reacts with humidity, moisture or oxygen, and the like, introduced into the adhesive to adsorb moisture or humidity. The physical adsorbent can increase the moving route of moisture or humidity penetrating into the encapsulation structure to suppress the penetration thereof, and maximize the barrier property against moisture and humidity through interaction with the matrix structure of the adhesive resin and the moisture-reactive adsorbent, and the like.

The specific kind of moisture adsorbents that can be used in the present application is not particularly limited, and for example, in the case of the moisture-reactive adsorbent, it may include one or a mixture of two or more of a metal powder such as alumina, a metal oxide, a metal salt or phosphorus pentoxide ($P_2O_5$), and the like, and in the case of the physical adsorbent, it may include silica, zeolite, titania, zirconia or montmorillonite, and the like.

Here, a specific example of the metal oxide may include alumina, lithium oxide ($Li_2O$), sodium oxide ($Na_2O$), barium oxide (BaO), calcium oxide (CaO) or magnesium oxide (MgO), and the like, an example of the metal salt may include sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); metal halides such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or metal chlorates such as barium perchlorate ($Ba(ClO_4)_2$) or magnesium perchlorate ($Mg(ClO_4)_2$), without being limited thereto.

In the present application, the moisture adsorbent such as metal oxides can be combined to the composition in an appropriately processed state. For example, the adhesive in which the above-described adhesive composition is prepared in a film form can be formed into a thin film having a thickness of 30 μm or less depending on the type of the organic electronic device to be applied, where a pulverizing process of the moisture adsorbent may be required. For pulverizing the moisture adsorbent, a process such as three roll mill, bead mill or ball mill may be used.

The adhesive composition of the present application may comprise the moisture absorbent in an amount of 0 to 100 parts by weight, 1 to 90 parts by weight, 5 to 80 parts by weight, or 10 to 60 parts by weight, relative to 100 parts by weight of the polymer derived from butylene. The moisture adsorbent is an optional component and thus may not be included, but preferably it is possible by controlling the content of the moisture adsorbent to 5 parts by weight or more that the cured product exhibits excellent moisture- and humidity-blocking properties. In addition, it is possible by controlling the content of the moisture adsorbent to 100 parts by weight or less to exhibit excellent moisture-blocking properties while forming a thin film encapsulation structure.

In this specification, unless otherwise specified, the unit "part by weight" means a weight ratio between the respective components.

The adhesive composition of the present application may comprise a filler, preferably an inorganic filler, if necessary. The filler can increase the moving route of moisture or humidity penetrating into the encapsulation structure to inhibit the penetration thereof, and maximize the barrier property against moisture and humidity through interaction with the matrix structure of the resin component and the moisture adsorbent, and the like. The specific kind of the filler that can be used in the present application is not particularly limited, and for example, one or a mixture of two or more of clay or talc, and the like may be used.

In the present application, in order to improve the bonding efficiency of the filler with an organic binder, a product surface-treated with an organic material may be used as the filler, or an additional coupling agent may be added thereto.

The adhesive composition of the present application may comprise 0 to 50 parts by weight, 1 to 40 parts by weight, or 1 to 20 parts by weight of the filler, relative to 100 parts by weight of the polymer derived from butylene. In the present application, the filler is an optional component and may not be included in the adhesive, but preferably by controlling it to 1 part by weight or more, the encapsulation structure having excellent moisture- or humidity-blocking properties and mechanical properties. In addition, in the present application, by controlling the content of the filler to 50 parts by weight or less in the present application, it is possible to provide the cured product which can be produced in the form of a film and exhibits excellent moisture-blocking properties even when formed into a thin film.

Furthermore, in one example, the adhesive composition may further comprise a dispersing agent so that the moisture adsorbent or the like can be uniformly dispersed. Here, as the usable dispersing agent, for example, a nonionic surfactant, and the like can be used, which has affinity with the surface of the moisture adsorbent and good compatibility with the adhesive resin.

The adhesive composition according to the present application may comprise, in addition to the above-described configurations, various additives in accordance with uses, the kind of the resin component, and the process for producing the adhesive layer as described below, within the range not affecting the above-described effects of the invention. For example, the adhesive composition may comprise a coupling agent, a cross-linking agent, a curable material, a UV stabilizer or an antioxidant, and the like in an appropriate range of content depending on the desired physical properties.

The present application also relates to an adhesive film. The adhesive film may comprise an adhesive layer comprising the above-mentioned adhesive composition. Here, the adhesive film may have a multi-layer structure. For example, the adhesive film may comprise two or more adhesive layers, and the composition of the two adhesive layers may be the same or different.

In an embodiment of the present application, the adhesive layer may have a storage elastic modulus measured at a temperature of 25° C., a strain of 5% and a frequency of 1 Hz after curing in a range of $10^5$ to $10^9$ Pa, 0.5 MPa to 800 MPa or 0.8 MPa to 500 MPa. It is possible by controlling the physical properties of the adhesive layer within the above-mentioned elastic modulus range to effectively suppress the stress in each layer constituting the flexible organic electronic device and to suppress the luminance change rate according to Equation 1 to be described below, so that the present application can provide an organic electronic device having reliability.

The structure of the adhesive film in the present application is not particularly limited, but in one example, the adhesive film may have a structure comprising a base material film or a release film (hereinafter, often referred to as "first film"); and the adhesive layer formed on the base material film or the release film.

The adhesive film of the present application may further comprise a base material film or a release film (hereinafter, often referred to as "second film") formed on the adhesive layer.

The specific kind of the first film that can be used in the present application is not particularly limited. In the present application, as the first film, for example, a typical polymer film in this field can be used. In the present application, for example, as the base material or the release film, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable mold release treatment may also be performed on one or both sides of the base material film or the release film of the present application. As an example of the release agent used in the releasing treatment of the base material film, alkyd-based, silicone-based, fluorine-based, unsaturated ester-based, polyolefin-based or wax-based release agents, and the like can be used, among which alkyd-based, silicone-based or fluorine-based release agents are preferably used from the viewpoint of heat resistance, but is not limited thereto.

Also, the type of the second film (hereinafter, often referred to as "cover film") that can be used in the present application is not particularly limited. For example, in the present application, as the second film, the same or different kinds of the first film may be used within the category exemplified in the above-described first film. Furthermore, in the present application, the second film may also be subjected to appropriate mold release treatment and used.

In the present application, the thickness of the base material film or the release film (first film) as above is not particularly limited and can be appropriately selected depending on uses to be applied. For example, in the present application, the thickness of the first film may be about 10 µm to 500 µm, preferably 20 µm to 200 µm or so. If the thickness is less than 10 µm, deformation of the base material film may easily occur during the manufacturing process, and if it exceeds 500 µm, it is not economical.

Also, in the present application, the thickness of the second film is not particularly limited. In the present application, for example, the thickness of the second film may also be set to be the same as that of the first film. In the present application, the thickness of the second film may be set to be relatively thin as compared with the first film in consideration of the processability and the like.

The thickness of the adhesive layer included in the adhesive film of the present application is not particularly limited and may be appropriately selected in accordance with the following conditions in consideration of uses to which the film is applied. The thickness of the adhesive layer included in the adhesive film of the present application may be about 5 µm to 200 µm, preferably 10 µm to 150 µm or so.

The present application also relates to a flexible organic electronic device. The organic electronic device may comprise an adhesive film containing the above-mentioned adhesive composition. As shown in FIGS. 1 and 2, an exemplary flexible organic electronic device may comprise a substrate (1) where an organic electronic element (2) is present on one side and an adhesive film (3) which is attached in a state of covering the entire surface of the organic electronic element (2) on the substrate (1). However, without being limited to the above, the adhesive film may be formed on the lower part of the substrate (1). In addition, the organic electronic device may further comprise a cover substrate (4) formed on the adhesive film (3). Furthermore, the organic electronic device may comprise one or more folding portions. For example, FIG. 2 shows the organic electronic device having one folding portion, wherein the folding portion is folded at a curvature radius of 1R. The folding portion may also satisfy Equation 1 below.

$$X \leq 10\% \qquad \text{[Equation 1]}$$

In Equation 1, X is a luminance change rate before and after a folding test in which a process of folding the folding portion of the organic electronic device to a curvature radius of 1R (1 mm) at a temperature at any one point of 15° C. to 35° C., for example, a temperature of 25° C. and a humidity at any one point of 30% to 80%, for example, a relative humidity of 50%, is repeated 100,000 times. The folding test is not limited to the above, and may be carried out by folding at any one curvature radius of 0.1R to 3R for 10,000 to 200,000 times. Here, the luminance change rate can be measured by measuring the luminance A of the folding portion before the folding test and the luminance B after the folding test with DISPLAY COLOR ANALYZER (CA-210, KONICA MINOLTA) equipment as a luminance meter, and calculating the change rate |(A-B)/A|×100. In Equation 1 above, X may be 8% or less, or 5% or less, and the lower limit is not particularly limited, but may be 0%. The organic electronic device according to the present application has flexibility, and can effectively suppress cracks capable of occurring in the organic electronic device despite the folding process of 100,000 times or more as above and can maintain excellent luminance.

The term "folding portion" may mean any one portion of an organic electronic device capable of being folded such that the organic electronic device has a curvature radius of 0.1R to 3R. The folding portion may be seen as a straight line when the organic electronic device is observed in a plan view, but is not limited thereto. In this specification, the unit R can be used in the same manner as mm, which is a unit of length, and 1R can mean that the curvature radius when the folding portion is folded is 1 mm. Furthermore, the folding process may mean a process of folding the folding portion. As described above, the organic electronic device of the present application may have one folding portion, without being limited thereto and, for example, two or more folding portions. Also, the flexible organic electronic device of the present application has folding portions on the entire surface of the device, and can be folded without limitation to any region.

As described above, the organic electronic device may further comprise a cover substrate. Here, the adhesive layer can attach the cover substrate to the surface of the substrate on which the organic electronic element is present. In the present application, the substrate or the cover substrate may be a polymer film. The material of the polymer film is not particularly limited, and can be exemplified by the above-mentioned polymer film.

In one example, if the physical properties of the adhesive film measured in this specification are physical properties which are changed by temperature, they may be physical properties measured at room temperature unless otherwise specified. The term room temperature herein is a natural temperature without warming or cooling, and for example, may mean a temperature at any point of about 15° C. to 35° C., a temperature at any point of 20° C. to 25° C., or a temperature of 25° C.

In one example, the adhesive layer of the present application may have a peel force (peel rate: 0.3 m/min, peel angle: 180°) to the substrate of 1000 gf/in or more. The adhesive layer may have a peel force (peel rate: 0.3 m/min, peel angle: 180°) to the cover substrate of 1000 gf/in or more. Since the organic electronic device of the present application has a folding portion, interfacial peeling may occur between the respective layers constituting the organic electronic device depending on several folds, but by controlling the peel force of the adhesive layer as above, defects due to the interfacial peeling can be suppressed.

Also, in one example, the coefficient of thermal expansion of the adhesive layer may be less than 80 μm/m° C. The coefficient of thermal expansion can be measured at a temperature at any point of 30° C. to 100° C. and under conditions of 0.1 N and 10° C./min. By controlling the coefficient of thermal expansion within the above range, the present application can prevent interfacial peeling or cracking caused by folding of the flexible organic electronic device, and consequently control the luminance change rate.

Furthermore, in one example, the adhesive may have a moisture permeability of 50 g/m²·day or less, 30 g/m²·day or less, 20 g/m²·day or less, or less than 15 g/m²·day. In the present application, the moisture permeability is a moisture permeability that after an adhesive as described below is cross-linked and cured and the cross-linked product or the cured product is made into a film shape having a thickness of 100 μm, it is measured in the thickness direction of the cross-linked product or the cured product under 100° F. and a relative humidity of 100%. The moisture permeability is also measured according to ASTM F1249. In the present application, the lower the value of the moisture permeability of the adhesive is, the better the performance of the encapsulation structure is, the lower limit of which is not particularly limited, and may be, for example, 0 g/m²·day, 1 g/m²·day, or 3 g/m²·day. Also, in one example, the adhesive may have a moisture content rate, as measured according to Kal-Fischer titration, of 0.05% or less, relative to the adhesive mass. The moisture content rate may be a moisture content rate that after nitrogen purging is performed using a Mitsubishi VA-236S equipment in the instrument and the container storage chamber for about 1 hour, it is measured for about 1 g of the adhesive sample (the measurement condition is a nitrogen gas temperature of 240° C., the flow rate is 250 ml/min and the measurement time is measured until the moisture measurement amount reaches 0.17 μg/s), but is not limited thereto. By controlling the moisture permeability to the above range or controlling the moisture content rate to the above range, permeation of moisture, humidity or oxygen into the organic electronic device can be effectively suppressed.

Also, in one example, the adhesive may have a dielectric constant of 4 F/m or less, or 3 F/m or less. The dielectric constant can be measured by a method known in the art, and for example, measured at 1 MHz using Agilent 4294A Precision Impedance Analyzer, after a sample of an adhesive is prepared to have a thickness of 100 μm, and then laminated between copper foils to a size of 2 cm×2 cm, without being limited thereto. It is preferred that the dielectric constant does not exceed 4 F/m with respect to the response speed of the touch sensor, considering that the organic electronic device described above is applied to a display device or the like.

Also, in one example, the adhesive may have a viscosity, as measured depending on shear stresses under conditions of a temperature at any one point of 50° C. to 70° C., a strain of 5% and a frequency of 1 Hz, in a range of 100 Pa·s to $10^4$ Pa·s or 500 Pa·s to 8,000 Pa·s. The adhesive satisfying the above viscosity range can realize excellent step filling property under vacuum heat cohesion conditions in the entire encapsulation of the organic electronic device. That is, in the present application, when the organic electronic element formed on the substrate is entirely encapsulated with the adhesive within the viscosity range, the adhesive can realize excellent filling property between the element and the substrate without an empty space at the stepped portion formed by the element.

Also, in one example, the adhesive layer may have good light transmittance with respect to the visible light region. For example, the light transmittance may be measured at 550 nm using a UV-Vis spectrometer. In one example, the adhesive layer of the present application may exhibit a light transmittance of 90% or more with respect to the visible light region. In addition, the adhesive layer of the present application can exhibit low haze with excellent light transmittance. In one example, the adhesive layer may exhibit a haze of 3% or less, 2% or less, 1% or less, 0.8% or less, 0.5% or less, or 0.3% or less. The adhesive layer of the present application can also be applied to an organic electronic device to implement excellent optical characteristics. The light transmittance or haze in the present application may be measured in accordance with JIS K7105 standard test method.

In one example, the organic electronic device of the present application can satisfy Equation 2 below.

$$Y \leq 10\% \qquad \text{[Equation 2]}$$

In Equation 2, Y is a light transmittance change rate before and after a folding test in which a process of folding the folding portion of the organic electronic device to a curvature radius of 1R (1 mm) at a temperature at any one point of 15° C. to 35° C., for example, a temperature of 25° C. and a humidity at any one point of 30% to 80%, for example, a relative humidity of 50%, is repeated 100,000 times. The folding test is not limited to the above, and may be carried out by folding at any one curvature radius of 0.1R to 3R for 10,000 to 200,000 times. The light transmittance can be measured at a wavelength of 550 nm using a UV-Vis spectrometer.

Also, in one example, the organic electronic device of the present application can satisfy Equation 3 below.

$$Z \leq 10\% \qquad \text{[Equation 3]}$$

In Equation 3, Z is a haze change rate before and after a folding test in which a process of folding the folding portion of the organic electronic device to a curvature radius of 1R (1 mm) at a temperature at any one point of 15° C. to 35° C., for example, a temperature of 25° C. and a humidity at any one point of 30% to 80%, for example, a relative humidity of 50%, is repeated 100,000 times. The folding test is not limited to the above, and may be carried out by folding at any one curvature radius of 0.1R to 3R for 10,000 to 200,000 times. The haze can be measured according to the JIS K7105 standard test method. In Equation 3 above, Z may be 8% or less, or 5% or less.

In order to realize the above-described physical properties by curing the adhesive composition to form an adhesive layer and applying the adhesive layer to the flexible organic electronic device, the components constituting the adhesive composition and the contents of the respective components can be controlled, which are the same as described above.

The organic electronic device according to the present application may comprise an organic electronic element, as described above.

The organic electronic element present on the top of the substrate region may comprise a first electrode layer and a second electrode layer, and may also comprise an organic layer present between the first and second electrode layers. The first and second electrode layers may be a hole-injection or electron-injection electrode layer commonly used in organic electronic devices. Any one of the first and second electrode layers may be formed of a hole-injection electrode layer and the other may be formed of an electron-injection electrode layer. Any one of the first and second electrode layers may be formed of a transparent electrode layer and the other may be formed of a reflective electrode layer. The hole-injection electrode layer may be formed using, for example, a material having a relatively high work function, and if necessary, may be formed using a transparent or reflective material. For example, the hole-injection electrode layer may comprise a metal, an alloy, an electrically conductive compound or a mixture of two or more thereof, having a work function of about 4.0 eV or more. As such a material, a metal such as gold, CuI, an oxide material such as ITO (indium tin oxide), IZO (indium zinc oxide), ZTO (zinc tin oxide), zinc oxide doped with aluminum or indium, magnesium indium oxide, nickel tungsten oxide, ZnO, $SnO_2$ or $In_2O_3$, a metal nitride such as gallium nitride, a metal selenide such as zinc selenide or a metal sulfide such as zinc sulfide, and the like can be exemplified. The transparent hole-injection electrode layer can also be formed by using a laminate of a metal thin film such as Au, Ag or Cu and a high refractive index transparent material such as ZnS, $TiO_2$ or ITO.

The hole-injection electrode layer may be formed by any means such as vapor deposition, sputtering, chemical vapor deposition or electrochemical means. In addition, if necessary, the formed electrode layer may be patterned through a process using known photolithography, shadow mask, or the like.

The electron-injection electrode layer can be formed using, for example, a material having a relatively low work function, and for example, can be formed using a suitable transparent or reflective material of materials used for forming the hole-injection electrode layer, without being limited thereto. The electron-injection electrode layer can also be formed using, for example, a vapor deposition method or a sputtering method, and the like, and if necessary, can be suitably patterned.

The electrode layer may be formed to have a thickness of, for example, about 90 nm to 200 nm, 90 nm to 180 nm, or about 90 nm to 150 nm or so.

An organic layer exists between the first and second electrode layers. The organic layer may comprise at least two light emitting units. In such a structure, light emitted from the light emitting unit can be emitted toward the transparent electrode layer through a process of being reflected by the reflective electrode layer.

The material constituting the light emitting unit is not particularly limited. Fluorescent or phosphorescent organic materials having various luminescent center wavelengths are known in the art, and the light emitting unit can be formed by selecting a suitable type of such known materials. As the material of the light emitting unit, a material of Alq series such as tris(4-methyl-8-quinolinolate)aluminum (III) (Alg3), 4-MAlq3 or Gaq3, a cyclopentadiene derivative such as C-545T ($C_{26}H_{26}N_2O_2S$), DSA-amine, TBSA, BTP, PAP-NPA, Spiro-FPA, $Ph_3Si$ (PhTDAOXD) or PPCP (1,2, 3,4,5-pentaphenyl-1,3-cyclopentadiene), DPVBi (4,4'-bis(2, 2'-diphenylyinyl)-1,1'-biphenyl), distyrylbenzene or a derivative thereof, or DCJTB (4-(dicyanomethylene)-2-tert-butyl-6-(1,1,7,7-tetramethylj ulolidyl-9-enyl)-4H-pyran), DDP, AAAP, NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $P_2Ir(acac)$, $op_2Ir(acac)$, $ppy_2Ir(acac)$, $tpy_2Ir(acac)$, FIrPPY (fac-tris [2-(4,5'-difluorophenyl)pyridine-C'2,N] iridium (III)) or $Btp_2Ir(acac)$(bis(2-(2'-benzo[4,5-a]thienyl)pyridinato-N,C3') iridium(acetylactonate)), and the like can be exemplified, but is not limited thereto. The light emitting unit may also have a host-dopant system which includes the above material as a host and also includes perylene, distyrylbiphenyl, DPT, quinacridone, rubrene, BTX, ABTX or DCJTB and the like as a dopant.

The light emitting unit may also be formed by appropriately employing a kind that exhibits light emission characteristics among the electron-accepting organic compounds or electron-donating organic compounds as described below.

As long as the organic layer comprises the light emitting unit, it may be formed with various structures further comprising a variety of other functional layers known in the art. As the layer that can be included in the organic layer, an electron injecting layer, a hole blocking layer, an electron transporting layer, a hole transporting layer and a hole injecting layer, and the like can be exemplified.

The electron injecting layer or the electron transporting layer can be formed using, for example, an electron accepting organic compound. Here, as the electron-accepting organic compound, any known compound can be used without any particular limitation. As such an organic compound, a polycyclic compound or a derivative thereof such as p-terphenyl or quaterphenyl, a polycyclic hydrocarbon compound or a derivative thereof such as naphthalene, tetracene, pyrene, coronene, chrysene, anthracene, diphenylanthracene, naphthacene or phenanthrene, a heterocyclic compound or a derivative thereof such as phenanthroline, bathophenanthroline, phenanthridine, acridine, quinoline, quinoxaline or phenazine, and the like can be exemplified. Fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinyl anthracene, diaminocarbazole, pyrane, thiopyrane, polymethine, merocyanine, quinacridone or rubrene, and the like or derivatives thereof, metal chelate complex compounds disclosed in Japanese Laid-Open Patent Publication No. 1988-295695, Japanese Laid-Open Patent Publication No. 1996-22557, Japanese Laid-Open Patent Publication No. 1996-81472, Japanese Laid-Open Patent Publication No. 1993-009470 or Japanese Laid-Open Patent Publication No. 1993-017764, and the like, for example, metal complexes having at least one 8-quinolinolato or derivative thereof as a ligand, such as tris(8-quinolinolato)aluminum, bis(8-quinolinolato)aluminum, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium or bis(5-chloro-8-quinolinolato)calcium, which is a metal chelated oxanoid compound, oxadiazole compounds disclosed in Japanese Laid-Open Patent Publication No. 1993-202011, Japanese Laid-Open Patent Publication No. 1995-179394, Japanese Laid-Open Patent Publication No. 1995-278124 or Japanese Laid-Open Patent Publication No. 1995-228579, and the like, triazine compounds disclosed in Japanese Laid-Open Patent Publication No. 1995-157473, and the like, stilbene derivatives or distyrylarylene derivatives, disclosed in Japanese Laid-Open Patent Publication No. 1994-203963, and the like, styryl derivatives disclosed in Japanese Laid-Open Patent Publication No. 1994-132080 or Japanese Laid-Open Patent Publication No. 1994-88072, and the like, diolefin derivatives disclosed in Japanese Laid-Open Patent Publication No. 1994-100857 or Japanese Laid-Open Patent Publication No. 1994-207170, and the like; fluorescent brightening agents such as benzooxazole compounds, benzothiazole compounds or benzoimidazole compounds; distyrylbenzene compounds such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene or 1,4-bis(2-methylstyryl)-2-ethylbenzene; distyrylpyrazine compounds such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine, dimethylidine compounds or derivatives thereof such as 1,4-phenylenedimethylidine, 4,4'-phenylenedimethylidine, 2,5-xylenedimethylidine, 2,6-naphthylenedimethylidine, 1,4-biphenylenedimethylidine, 1,4-para-terephenylenedimethylidine, 9,10-anthracenediyldimethylidine, 4,4'-(2,2-di-t-butylphenylvinyl)biphenyl or 4,4'-(2,2-diphenylvinyl)biphenyl, silanamine derivatives disclosed in Japanese Laid-Open Patent Publication No. 1994-49079 or Japanese Laid-Open Patent Publication No. 1994-293778, and the like, multifunctional styryl compounds disclosed in Japanese Laid-Open Patent Publication No. 1994-279322 or Japanese Laid-Open Patent Publication No. 1994-279323, and the like, oxadiazole derivatives disclosed in Japanese Laid-Open Patent Publication No. 1994-107648 or Japanese Laid-Open Patent Publication No. 1994-092947, and the like, anthracene compounds disclosed in Japanese Laid-Open Patent Publication No. 1994-206865, and the like, oxynate derivatives disclosed in Japanese Laid-Open Patent Publication No. 1994-145146, and the like, tetraphenylbutadiene compounds disclosed in Japanese Laid-Open Patent Publication No. 1992-96990, organic trifunctional compounds disclosed in Japanese Laid-Open Patent Publication No. 1991-296595, and the like, coumarin derivatives disclosed in Japanese Laid-Open Patent Publication No. 1990-191694, and the like, perylene derivatives disclosed in Japanese Laid-Open Patent Publication No. 1990-196885, and the like, naphthalene derivatives disclosed in Japanese Laid-Open Patent Publication No. 1990-255789, and the like, phthaloperynone derivatives disclosed in Japanese Laid-Open Patent Publication No. 1990-289676 or Japanese Laid-Open Patent Publication No. 1990-88689, and the like, or styrylamine derivatives disclosed in Japanese Laid-Open Patent Publication No. 1990-250292, and the like can be also used as an electron-accepting organic compound included in the low refractive layer. In addition, the electron injecting layer can be also formed using a material such as LiF or CsF.

The hole blocking layer is a layer capable of improving the lifetime and efficiency of the element by preventing the injected holes from entering into the electron-injection electrode layer via the light emitting unit, and if necessary, can be formed in an appropriate portion between the light emitting unit and the electron-injection electrode layer by using a known material.

The hole injecting layer or the hole transporting layer may comprise, for example, an electron donating organic compound. As the electron donating organic compound, arylamine compounds such as N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, 4-N,N-diphenylamino-(2-diphenylvinyl)benzene, 3-methoxy-4'-N,N-diphenylaminostylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamono)-4'-[4-(di-p-tolylamino)styryl]stilbene, N,N,N',N'-tetraphenyl-4,4'-diaminobiphenyl-N-phenylcarbozole, 4,4'-bis[N-(1-naphthyl)-N-phenylamino]biphenyl, 4,4"-bis[N-(1- naphthyl)-N-phenylamino]-p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino] naphthalene, 2,6-bis[N-(1-naphthyl)-N-(2-naphthyl)amino] naphthalene, 4,4"-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorene or 4,4"-bis(N,N-di-p-tolylamino)terphenyl, and bis(N-1-naphthyl) (N-2-naphthyl)amine can be representatively exemplified, without being limited thereto.

The hole injecting layer or the hole transporting layer may be formed by dispersing an organic compound in a polymer, or by using a polymer derived from the organic compound. Furthermore, so-called π-conjugated polymers such as poly-paraphenylenevinylene and derivatives thereof, hole-transporting non-conjugated polymers such as poly(N-vinylcarbazole) or σ-conjugated polymers such as polysilanes, and the like may also be used.

The hole injecting layer may be formed by using metal phthalocyanine such as copper phthalocyanine or nonmetal phthalocyanine, or electrically conductive polymers such as a carbon film and polyaniline, or by reacting the arylamine compound as an oxidizing agent with a Lewis acid.

The specific structure of the organic layer is not particularly limited. In this field, various materials for forming a hole or electron injecting electrode layer and an organic layer, for example, a light emitting unit, an electron injecting or transporting layer, a hole injecting or transporting layer, and forming methods thereof are known, and all the above methods may be applied to manufacture the organic electronic device.

Furthermore, the organic electronic element of the present application may comprise a protective layer. The protective layer can prevent damage to the electrode, be composed of typical materials in this technical field, and for example, comprise SiNx or $Al_2O_3$, and the like as an inorganic material.

The present application also relates to a method for manufacturing the organic electronic device.

The manufacturing method may comprise steps of forming an adhesive layer comprising a polymer derived from butylene and a curable oligomer on a substrate, one surface of which an organic electronic element is present on, and curing the adhesive layer.

The term "curing" herein may mean that the adhesive composition of the present invention forms a cross-linked structure through heating or UV irradiation processes to be produced in the form of an adhesive.

Specifically, an organic electronic element may be formed by forming an electrode on a polymer film used as a substrate with a method such as vacuum deposition or sputtering, forming a luminescent organic material layer composed of, for example, a hole transporting layer, a light emitting layer and an electron transporting layer, and the like on the electrode and then further forming an electrode layer on the top. Subsequently, in the substrate performed by the above process, the above-described adhesive layer is placed on the surface on which the element is formed, so that the entire surface of the element is encapsulated. Subsequently, the adhesive layer may be formed by heating the adhesive layer and pressing it in a state where fluidity is imparted thereto, with a laminator or the like, and cross-linking the resin in the adhesive layer.

In one example, the adhesive layer positioned to cover the entire surface of the organic electronic element may be previously transferred to the cover substrate. The transfer of the adhesive layer to the cover substrate can be also carried out, for example, by heating the adhesive layer in contact with the cover substrate using a vacuum press or a vacuum laminator and the like. If the adhesive contains a thermo-setting curable polymer, there is a concern that the curing reaction is excessively performed in the above process and sticking force or adhesiveness of the adhesive layer is reduced, and thus it is possible to control the process temperature to about 100° C. or less and the process time within 5 minutes.

The adhesive layer may be formed by positioning the cover substrate onto which the adhesive layer is transferred on the organic electronic element, and performing the hot pressing process.

Although one example of the method for manufacturing the organic electronic device has been mentioned above, the organic electronic device may be manufactured in other ways as well. For example, the device is manufactured in the same manner as described above, but the order or conditions of the process may be changed.

The present application also relates to a use of the organic electronic device, for example, an organic light emitting device. The organic light emitting device may be effectively applied to a backlight of a liquid crystal display (LCD), an illumination, a light source of various sensors, a printer, a copy machine, a vehicle instrument light source, a signal lamp, an indicating lamp, a display device, a light source of a planar light emitter, a display, a decoration, or various lights, and the like. In one example, the present application relates to a lighting apparatus comprising the flexible organic electronic device. In addition, the present application relates to a display device comprising the flexible organic electronic device as a light source. When the organic electronic element is applied to the lighting apparatus or other uses, other components constituting the device or the like, or the methods for constituting the device are not particularly limited, and as long as the organic electronic element is used, any material or method known in the relevant field may be employed.

Advantageous Effects

The present application provides a flexible organic electronic device that does not only realize excellent moisture barrier characteristics, but also has excellent endurance reliability under high temperature and high humidity conditions while having flexible characteristics, and provides an adhesive composition applied to the flexible organic electronic device and an adhesive film comprising the same.

BRIEF DESCRIPTION OF DRAWINGS

FIGS. 1 and 2 are cross-sectional views illustrating exemplary organic electronic devices.

EXPLANATION OF REFERENCE NUMERALS

1: substrate
2: organic electronic element

3: adhesive layer or adhesive film
4: cover substrate

BEST MODE

Hereinafter, the present invention will be described in more detail with reference to Examples complying with the present invention and Comparative Examples not complying with the present invention, but the scope of the present invention is not limited by the following examples.

EXAMPLE 1

A styrene-isobutylene copolymer (SIBS 062M, Mw: 60,000, Kaneka) as a polymer derived from butylene, a hydrogenated bisphenol A epoxy resin (YX8000, epoxy equivalent: 201 g/eq, Mitsubishi Chemical) as a curable oligomer, and an alicyclic epoxy compound (Celloxide 2021P, Mw: 250, Daicel corporation) as a curable monomer were introduced into a reaction vessel at a weight ratio of 50:30:20 (SIBS 062M: YX8000: Celloxide 2021P), respectively, and CXC1612 (King Industry) as a cationic photoinitiator was added thereto in an amount of 0.1 parts by weight, relative to 100 parts by weight of the polymer, and then diluted with toluene to a solid content of about 15% by weight to prepare an adhesive composition coating solution.

An adhesive film was produced by coating the prepared solution on the releasing surface of the releasing PET and drying it in an oven at 100° C. for 15 minutes to form an adhesive layer having a thickness of 50 µm.

EXAMPLE 2

An adhesive composition and an adhesive film were produced in the same manner as in Example 1, except that a styrene-isobutylene copolymer (SIBS 102T, Mw: 100,000, Kaneka) as a polymer derived from butylene, a hydrogenated bisphenol A epoxy resin (YX8000, Mitsubishi Chemical) as a curable oligomer, and a silane-modified epoxy resin (KSR-177, Kukdo Chemical) as a curable monomer were introduced into a reaction vessel at a weight ratio of 60:15:25 (SIBS 102T: YX8000: KSR-177), respectively.

COMPARATIVE EXAMPLE 1

Polyisobutylene (B50, BASF) as a polymer derived from butylene, a hydrogenated petroleum resin (SU90, Kolon), and 1,6-hexandediol diacrylate (M200, Miwon Commercial Co., Ltd.) were introduced into a reaction vessel at a weight ratio of 60:30:10 (B50: SU90: M200), respectively, and Irgacure654 (Ciba) as a radical initiator was added thereto in an amount of 0.1 parts by weight, relative to 100 parts by weight of the polymer, and then diluted with toluene to a solid content of about 15% by weight to prepare an adhesive composition coating solution.

An adhesive film was produced by coating the prepared solution on the releasing surface of the releasing PET and drying it in an oven at 100° C. for 15 minutes to form an adhesive layer having a thickness of 50 µm.

COMPARATIVE EXAMPLE 2

An adhesive composition and an adhesive film were produced in the same manner as in Comparative Example 1, except that polyisobutylene (B50, BASF) as a polymer derived from butylene, a hydrogenated petroleum resin (SU90, Kolon), and 1,6-hexandediol diacrylate (M200, Miwon Commercial Co., Ltd.) were introduced into a reaction vessel at a weight ratio of 50:40:10 (B50: SU90: M200), respectively.

COMPARATIVE EXAMPLE 3

An adhesive composition and an adhesive film were produced in the same manner as in Example 1, except that a silane-modified epoxy resin (KSR-277, Kukdo Chemical) and an alicyclic epoxy compound (Celloxide 2021P, Daicel corporation) were introduced into a reaction vessel at a weight ratio of 70:30 (KSR-277: Celloxide 2021P), respectively.

COMPARATIVE EXAMPLE 4

An adhesive composition and an adhesive film were produced in the same manner as in Example 1, except that a bisphenol A type phenoxy resin (YP-50, Kukdo Chemical), a high molecular weight silane-modified epoxy resin (KSR-277, Kukdo Chemical) and a silane-modified epoxy resin (KSR-177, Kukdo Chemical) were introduced into a reaction vessel at a weight ratio of 40:30:30 (YP-50: KSR-277: KSR-177), respectively.

EXPERIMENTAL EXAMPLE 1

Storage Elastic Modulus after Curing

After curing the adhesive film prepared in Examples and Comparative Examples with a UV dose of 1000 mJ/cm$^2$ or at 110° C. for 1 hour, the film was laminated to a thickness of 600 µm, and physical properties were measured using ARES equipment as follows.

The storage elastic modulus was measured in conditions of a temperature of 25° C., a strain of 5% and a frequency of 1 Hz.

EXPERIMENTAL EXAMPLE 2

Viscosity Before Curing

Before curing the adhesive film prepared in Examples and Comparative Examples, the film was laminated to a thickness of 600 µm, and physical properties were measured using ARES equipment as follows. The viscosity was measured depending on shear stress in conditions of a temperature of 65° C., a strain of 5% and a frequency of 1 Hz.

EXPERIMENTAL EXAMPLE 3

Step Filling Property

In a simple substrate on which steps of 10 µm are formed, the adhesive film prepared in Examples and Comparative Examples was attached to the center portion by using a roll laminator. A glass having the same size as the prepared specimen is pressed in the vertical direction and bonded together by applying a vacuum of 100 pa and a pressure of 0.5 MPa under a temperature condition of 65° C. with a vacuum bonding machine. The cohesiveness was determined depending on looseness of the step forming region in the front side of the adhesive and classified as O when the loosed portion of the step formation region is 10% or less of the total area, Δ when it is 30% or less and X when it is 50% or more.

EXPERIMENTAL EXAMPLE 4

Presence of Cracks

A transparent electrode is formed on a polyimide substrate by a vacuum deposition method, and an organic material layer is formed on the transparent electrode. The organic material layer comprises a hole injecting layer, a hole transporting layer, a light emitting layer, an electron injecting layer and an electron transporting layer. Then, a reflective electrode is further formed on the organic material layer. Thereafter, the adhesive film prepared in Examples and Comparative Examples was sealed so as to encapsulate the entire surface of the organic electronic element on the substrate, a cover substrate was formed on the adhesive film, and then curing was carried out under the same conditions as Experimental Example 1.

For the prepared organic electronic device, the presence or absence of cracks was visually observed after the folding test in which the process of folding the folding portion of the organic electronic device to a curvature radius of 1R (1 mm) under a temperature of 25° C. and a relative humidity of 50%, is repeated 100,000 times. It was classified as O without any crack or interface separation, Δ when at least one of crack or interface separation is observed and X when observed in large quantities.

EXPERIMENTAL EXAMPLE 5

Moisture Permeability

The adhesive composition prepared in Examples or Comparative Examples was applied to a base film (release polyester film, RS-21G, manufactured by SKC) having a thickness of 38 μm. Then, it was dried at 110° C. for 10 minutes to prepare a film-shaped layer having a thickness of 100 μm. Thereafter, the base film was peeled off, and the moisture permeability of the film-shaped layer to the thickness direction was measured in a state where the film-shaped layer was positioned at 100° F. and a relative humidity of 100%. The moisture permeability was measured in accordance with the provisions of ASTM F1249.

TABLE 1

| | Storage elastic modulus after curing (MPa) | Viscosity at 65° C. before curing (Pa·s) | Step filling property | Presence of cracks | WVTR |
|---|---|---|---|---|---|
| Example 1 | 1.0 | 1500 | ○ | ○ | 5 |
| Example 2 | 2.1 | 5000 | Δ | ○ | 5 |
| Comparative Example 1 | 0.3 | 20000 | × | ○ | 3 |
| Comparative Example 2 | 0.1 | 15000 | × | × | 3 |
| Comparative Example 3 | 2000 | 300 | ○ | × | 20 |
| Comparative Example 4 | 700 | 1000 | ○ | Δ | 15 |

The invention claimed is:

1. An adhesive composition, comprising:
   a polymer derived from butylene,
   a curable oligomer which is an aromatic compound; and
   a curable monomer comprising one or more functional groups selected from among a glycidyl group, an isocyanate group, an amide group, an epoxide group, a cyclic ether group, a sulfide group, an acetal group, and a lactone group.

2. The adhesive composition according to claim 1, wherein the polymer derived from butylene is
   a homopolymer of a butylene monomer,
   a copolymer obtained by copolymerizing a second monomer polymerizable with a butylene monomer,
   a reactive oligomer using a butylene monomer, or
   a mixture thereof.

3. The adhesive composition according to claim 2, wherein the second monomer is isoprene, styrene or butadiene.

4. The adhesive composition according to claim 2, wherein the reactive oligomer using a butylene monomer comprises:
   a butylene polymer having a reactive functional group; or
   a butylene polymer bonded to another polymer having a reactive functional group.

5. The adhesive composition according to claim 1, wherein the polymer derived from butylene has a weight average molecular weight in a range of 10,000 to 2,000,000 g/mol.

6. The adhesive composition according to claim 1, wherein the curable oligomer is a hydrogenated compound.

7. The adhesive composition according to claim 1, wherein the curable oligomer has a weight average molecular weight in a range of 400 to 10,000 g/mol.

8. The adhesive composition according to claim 1, wherein the curable oligomer is a hydrogenated aromatic epoxy compound.

9. The adhesive composition according to claim 8, wherein the curable oligomer has an epoxy equivalent in a range of 100 to 1500 g/eq.

10. The adhesive composition according to claim 1, wherein the curable oligomer is included in an amount of 15 to 100 parts by weight, relative to 100 parts by weight of the polymer derived from butylene.

11. The adhesive composition according to claim 1, wherein the curable monomer has a weight average molecular weight of less than 400 g/mol.

12. The adhesive composition according to claim 1, wherein the curable monomer has a cyclic structure in which ring constituent atoms in the molecular structure are in a range of 3 to 10.

13. The adhesive composition according to claim 1, wherein the curable monomer is included in an amount of 20 to 80 parts by weight, relative to 100 parts by weight of the polymer derived from butylene.

14. The adhesive composition according to claim 1, wherein the curable monomer and the curable oligomer are included in proportions of 10 to 50 parts by weight and 20 to 70 parts by weight, respectively, relative to 100 parts by weight of the polymer derived from butylene.

15. The adhesive composition according to claim 1, comprising no tackifier.

16. An adhesive film having an adhesive layer comprising the adhesive composition of claim 1.

17. The adhesive film according to claim 16, wherein the adhesive layer has a storage elastic modulus, as measured under conditions of a temperature of 25° C., a strain of 5% and a frequency of 1 Hz after curing, in a range of $10^5$ Pa to $10^9$ Pa.

18. A flexible organic electronic device comprising a substrate in which an organic electronic element is formed on one surface, and the adhesive film according to claim 16 attached in a state covering the entire surface of said organic electronic element on said substrate.

19. The flexible organic electronic device according to claim 18, comprising at least one folding portion satisfying Equation 1 below:

$$X \leq 10\% \quad \text{[Equation 1]}$$

wherein, X is a luminance change rate before and after a folding test in which a process of folding the folding portion of said organic electronic device to a curvature radius of 1R (1mm) at a temperature of 25° C. and a relative humidity of 50%, is repeated 100,000 times.

20. The flexible organic electronic device according to claim 18, further comprising a cover substrate, wherein the adhesive layer attaches said cover substrate to the surface of said substrate on which the organic electronic element exists.

* * * * *